(12) United States Patent
Vaartstra

(10) Patent No.: US 6,329,286 B1
(45) Date of Patent: *Dec. 11, 2001

(54) METHODS FOR FORMING CONFORMAL IRIDIUM LAYERS ON SUBSTRATES

(75) Inventor: Brian A. Vaartstra, Nampa, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/300,017

(22) Filed: Apr. 27, 1999

(51) Int. Cl.[7] .......................... H01L 21/311; H01L 21/44; C23C 16/00
(52) U.S. Cl. .......................... 438/650; 438/260; 427/252
(58) Field of Search .................. 427/252, 53.1, 427/124, 125, 99, 554; 257/768, 751, 306, 309; 252/182.12, 182.3; 438/650, 260

(56) References Cited

U.S. PATENT DOCUMENTS

| | | |
|---|---|---|
| 3,839,164 | 10/1974 | Hurst . |
| 4,830,982 | 5/1989 | Dentai et al. . |
| 4,992,305 | 2/1991 | Erbil . |
| 5,096,737 | 3/1992 | Baum et al. . |
| 5,130,172 * | 7/1992 | Hicks et al. .................. 427/252 |
| 5,149,596 | 9/1992 | Smith et al. . |
| 5,187,638 | 2/1993 | Sandhu et al. . |
| 5,198,386 | 3/1993 | Gonzalez . |
| 5,220,044 | 6/1993 | Baum et al. . |
| 5,232,873 | 8/1993 | Geva et al. . |
| 5,252,518 | 10/1993 | Sandhu et al. . |
| 5,270,241 | 12/1993 | Dennison et al. . |
| 5,341,016 | 8/1994 | Prall et al. . |
| 5,354,712 | 10/1994 | Ho et al. . |
| 5,372,849 | 12/1994 | McCormick et al. . |
| 5,392,189 | 2/1995 | Fazan et al. . |
| 5,403,620 * | 4/1995 | Kaesz et al. .................. 427/252 |
| 5,464,786 | 11/1995 | Figura et al. . |
| 5,478,772 | 12/1995 | Fazan . |
| 5,480,684 | 1/1996 | Sandhu . |
| 5,487,923 | 1/1996 | Min et al. . |
| 5,498,562 | 3/1996 | Dennison et al. . |
| 5,506,166 | 4/1996 | Sandhu et al. . |
| 5,510,651 | 4/1996 | Maniar et al. . |
| 5,520,992 | 5/1996 | Douglas et al. . |
| 5,555,486 | 9/1996 | Kingon et al. . |
| 5,561,307 | 10/1996 | Mihara et al. . |
| 5,566,045 | 10/1996 | Summerfelt et al. . |
| 5,581,436 | 12/1996 | Summerfelt et al. . |
| 5,605,857 | 2/1997 | Jost et al. . |

(List continued on next page.)

FOREIGN PATENT DOCUMENTS

| | | |
|---|---|---|
| 0 301 725 A2 | 2/1989 | (EP) . |
| 0 770 862 | 5/1997 | (EP) . |
| 9 162372 | 6/1997 | (JP) . |

OTHER PUBLICATIONS

Bhatt et al., "Novel high temperature multi–layer electrode barrier structure for high–density ferroelectric memories," *Applied Physics Letters*, 71, 719–721 (1997).

(List continued on next page.)

*Primary Examiner*—Matthew Smith
*Assistant Examiner*—Igwe U. Anya
(74) *Attorney, Agent, or Firm*—Mueting, Raasch & Gebhardt, P.A.

(57) ABSTRACT

A method of forming a generally conformal iridium layer (preferably, an iridium metal layer optionally containing oxides of iridium) on a substrate, such as a semiconductor wafer, using complexes of the formula $CpIr(CO)_2$ wherein Cp is a substituted or unsubstituted cyclopentadienyl ligand; and forming a generally conformal iridium layer on a surface of the substrate, wherein the layer is formed from the precursor composition in the presence of one or more carrier gases and one or more oxidizing gases.

18 Claims, 3 Drawing Sheets

U.S. PATENT DOCUMENTS

| | | |
|---|---|---|
| 5,618,746 | 4/1997 | Hwang . |
| 5,639,698 | 6/1997 | Yamazaki et al. . |
| 5,654,222 | 8/1997 | Sandhu et al. . |
| 5,654,224 | 8/1997 | Figura et al. . |
| 5,661,115 | 8/1997 | Sandhu . |
| 5,663,088 | 9/1997 | Sandhu et al. . |
| 5,679,225 | 10/1997 | Pastacaldi et al. . |
| 5,691,009 | 11/1997 | Sandhu . |
| 5,696,384 * | 12/1997 | Ogi et al. .................. 252/182.12 |
| 5,717,250 | 2/1998 | Schuele et al. . |
| 5,728,626 | 3/1998 | Allman et al. . |
| 5,744,832 | 4/1998 | Wolters et al. . |
| 5,760,474 | 6/1998 | Schuele . |
| 5,962,716 | 10/1999 | Uhlenbrock et al. . |
| 5,970,378 | 10/1999 | Shue et al. . |
| 5,972,105 | 10/1999 | Yamazaki et al. . |
| 5,990,559 * | 11/1999 | Marsh .......................... 257/768 |
| 6,074,945 | 6/2000 | Vaartstra et al. . |
| 6,127,257 | 10/2000 | Pintchovski et al. . |
| 6,133,159 | 10/2000 | Vaartstra et al. . |
| 6,218,297 * | 4/2001 | Marsh .......................... 438/654 |

OTHER PUBLICATIONS

Cohan et al., "Laser–assisted organometallic chemical vapor deposition of films of rhodium and iridium," *Appl. Phys. Lett,.* 60, 1402–1403 (1992).

Doppelt et al., "Mineral precursor for chemical vapor deposition of Rh metallic films," *Mater. Sci. Eng.*, B17, 143–146 (1993).

Etsupler et al., "Deposition of Thin Rhodium Films by Plasma–Enhanced Chemical Vapor Deposition,"*Appl. Phys. A*, 48, 373–375 (1989).

Hoke et al., "Low–temperature Vapour Deposition of High––purity Iridium Coatings from Cyclooctadiene Complexes of Iridium," *J. Mater. Chem.*, 1, 551–554 (1991).

Hsu et al., "Synthesis and X–ray structure of the heteronuclear cluster, $(\mu-H)_2(\eta^5-C_5H_5)IrOs_3(CO)_{10}$," *Journal of Organometallic Chemistry*, 426, 121–130 (1992).

Kaesz et al., "Low–Temperature Organometallic Chemical Vapor Deposition of Transition Metals," *Mat. Res. Soc. Symp. Proc.*, 131, 395–400 (1989).

Khakani et al., "Pulsed laser deposition of highly conductive iridium oxide thin films," *Appl. Phys. Lett.*, 69, 2027–2029 (1996).

Kumar et al., "New precursors for organometallic chemical vapor deposition of rhodium," *Can. J. Chem.*, 69, 108–110 (1991).

Lu et al., "Ultrahigh vacuum chemical vapor deposition of rhodium thin films on clean and $TiO_2$–covered Si(111)," *Thin Solid Films*, 208, 172–176 (1992).

Macomber et al., "The Synthesis and $^1H$ NMR Study of Vinyl Organometallic Monomers: $(\eta^5-C_5H_4CH=CH_2)M(CO)_2(NO)(M=Cr, Mo, W)$ and $(\eta^5-C_5H_4CH=CH_2)M(CO)_2$ (M=Ch, Rh, Ir)," *Journal of Organometallic Chemistry*, 250, 311–318 (1983).

Rausch et al., "Isolation and Structural Characterization of Bis($\eta^5$–cyclopentadienyl)bis(carbonyl)–$\mu$–(o–phenylene)–diiridium(Ir–Ir), $(C_5H_5)_2Ir_2(C_6H_4)$: A Product Formally Derived from the Double Oxidative Addition of Benzene to Iridium," *J. Amer. Chem. Soc.*, 99, 7870–7876 (1977).

Smith et al., "Low–Temperature Chemical Vapor Deposition of Rhodium and Iridium Thin Films," *Mat. Res. Soc. Symp. Proc.*, 168, 369–374 (1990).

Uchida et al., "Preparation of organoiridium compound for metalorganic chemical vapor deposition (MOCVD) of thin film of iridium pr iridium oxide," (Abstract of JP 08,306, 627) *CA Selects: Chemical Vapor Deposition*, 5, 1, Abstract No. 126:89572d (1997).

Van Hemert et al., "Vapor Deposition of Metals by Hydrogen Reduction of Metal Chelates," *J. Electrochem. Soc.*, 112, 1123–1126 (1965).

Versteeg et al., "Metalorganic Chemical Vapor Deposition by Pulsed Liquid Injection Using An Ultrasonic Nozzle: Titanium Dioxide on Sapphire from Titanium (IV) Isopropoxide," *J. American Ceram. Soc.*, 78, 2763–2768 (1995).

Green et al., "Chemical Vapor Deposition of Ruthenium and Ruthenium Dioxide Films," *J. Electrochem. Soc.,* 132:2677–2685 (1985).

Johnson et al., "Some Reactions of triruthenium Dodecacarbonyl," *Nature*, 901–902 (March 1967).

Liao et al., "Characterization of $RuO_2$ thin films deposited on Si by metal–organic chemical vapor deposition," *Thin Solid Films,* 287:74–79 (1996).

Macchioni et al., "Catonic Bis– and Tris($\eta$2–(pyrazol–1–y1)methane) Acetyl Complexes of Iron (II) and Ruthenium (II): Synthesis, Characterization, Reactivity, and Interionic Solution Structure by NOESY NMR Spectroscopy," *Organometallics*, 16(10):2139–2145 (1997).

Niemer et al., "Organometallic chemical vapor deposition of tungsten metal, and suppression of carbon incorporation by codeposition of platinum," *Appl. Phys. Lett.*, 61(15):1793–1795 (1992).

Pathangey et al., "Various approaches have been explored to obtain atomic layer controlled growth, but one of the most straightforward growth techniques is molecular beam epitaxy (MBE)," *Vacuum Technology and Coating*, 33–41 (May 2000).

Suntola, "Atomic layer epitaxy," *Thin Solid Films*, 216:84–89 (1992).

Takasu et al., "Preparation of a novel $PT-RuO_2/Ti$ electrocatalyst by use of highly porous ruthenium oxide support prepared from $RuO_2-La_2O_3$/electrode," *J. Alloys Compounds*, 261:172–175 (1997).

\* cited by examiner

METHODS FOR FORMING CONFORMAL IRIDIUM LAYERS ON SUBSTRATES

FIELD OF THE INVENTION

This invention relates to the preparation of generally conformal iridium layers on substrates, particularly on semiconductor device structures.

BACKGROUND OF THE INVENTION

Films (i.e., layers) of metals and metal oxides, particularly the heavier elements of Group VIII, are becoming important for a variety of electronic and electrochemical applications. For example, high quality $RuO_2$ thin films deposited on silicon wafers have recently gained interest for use in ferroelectric memories. Many of the Group VIII metal films are generally unreactive toward silicon and metal oxides, resistant to diffusion of oxygen and silicon, and are good conductors. Oxides of certain of these metals also possess these properties, although perhaps to a different extent.

Thus, layers of Group VIII metals and metal oxides, particularly the second and third row metals (e.g., Ru, Os, Rh, Ir, Pd, and Pt), have suitable properties for a variety of uses in integrated circuits. For example, they can be used in integrated circuits for electrical contacts. They are particularly suitable for use as barrier layers between the dielectric material and the silicon substrate in memory devices, such as ferroelectric memories. Furthermore, they may even be suitable as the plate (i.e., electrode) itself in capacitors. Iridium oxide is of particular interest as a barrier layer because it is very conductive (30–60 $\mu\Omega$-cm) and is inherently a good oxidation barrier.

Capacitors are the basic charge storage devices in random access memory devices, such as dynamic random access memory (DRAM) devices, static random access memory (SRAM) devices, and now ferroelectric memory (FE RAM) devices. They consist of two conductors, such as parallel metal or polysilicon plates, which act as the electrodes (i.e., the storage node electrode and the cell plate capacitor electrode), insulated from each other by a dielectric material (a ferroelectric dielectric material for FE RAMs). It is important for device integrity that oxygen and/or silicon not diffuse into or out of the dielectric material. This is particularly true for ferroelectric RAMs because the stoichiometry and purity of the ferroelectric material greatly affect charge storage and fatigue properties.

Thus, there is a continuing need for methods and materials for the formation of metal layers, such as iridium metal or metal oxide layers, which can function as barrier layers, for example, in integrated circuits, particularly in random access memory devices. There is a particular need for metal or metal oxide layers in contact openings which are extremely small and require conformally filled layers.

SUMMARY OF THE INVENTION

The present invention is directed to methods for manufacturing a semiconductor device, particularly a ferroelectric device. The methods involve forming generally conformal iridium layers on substrates, such as semiconductor substrates or substrate assemblies during the manufacture of semiconductor structures. The resultant generally conformal iridium layer can be used as a barrier layer or electrode in an integrated circuit structure, particularly in a memory device such as a ferroelectric memory device.

The term "iridium layer" preferably refers to relatively pure metal films of iridium optionally including oxides of iridium. The term "conformal" refers to a layer having generally uniform step coverage. Preferably, the term "conformal" refers to a step coverage of greater than about 70%, and more preferably, greater than about 80%, in greater than about 2:1 aspect ratio cavities. Herein, "step coverage" is the thickness of the layer in the bottom of a hole divided by the thickness of the layer on the top surface (outside the hole) times 100 (to convert to a percentage).

One preferred method of the present invention involves forming a layer on a substrate, such as a semiconductor substrate or substrate assembly during the manufacture of a semiconductor structure. The method includes: providing a substrate (preferably, a semiconductor substrate or substrate assembly); providing a precursor composition including one or more complexes of the formula:

$$CpIr(CO)_2 \qquad \text{(Formula I)}$$

wherein Cp is a substituted or unsubstituted cyclopentadienyl ligand; vaporizing the precursor composition (which optionally includes one or more solvents) to form vaporized precursor composition; and directing the vaporized precursor composition in the presence of one or more carrier gases and one or more oxidizing gases toward the substrate to form a generally conformal iridium layer (preferably, an iridium metal layer optionally including oxides of iridium) on a surface of the substrate. Using such methods, the complexes of Formula I are converted in some manner (e.g., decomposed thermally) and deposited on a surface to form a generally conformal layer. Thus, the layer is not simply a layer of the complex of Formula I.

Preferably, in the methods of the invention the ratio of the total number of moles of carrier gases to the total number of moles of oxidizing gases is within a range of about 0.6:1.0 to about 1.4:1.0, more preferably, within a range of about 0.7:1.0 to about 1.3:1.0, and most preferably, the total number of moles of carrier gases to the total number of moles of oxidizing gases is substantially similar. In this context "substantially similar" means that the total number of moles of carrier gases to oxidizing gases are within about 10% of each other.

In certain preferred embodiments, the partial pressure of $CpIr(CO)_2$ in the carrier gas is about 0.001 torr to about 10 torr. In other preferred embodiments, Cp of Formula I is monomethyl cyclopentadienyl.

Complexes of Formula I are neutral complexes and may be liquids or solids at room temperature. Typically, however, they are liquids. If they are solids, they are preferably sufficiently soluble in an organic solvent or have melting points below their decomposition temperatures such that they can be used in flash vaporization, bubbling, microdroplet formation techniques, etc. However, they may also be sufficiently volatile that they can be vaporized or sublimed from the solid state using known chemical vapor deposition techniques. Thus, the precursor compositions of the present invention can be in solid or liquid form. As used herein, "liquid" refer to a solution or a neat liquid (a liquid at room temperature or a solid at room temperature that melts at an elevated temperature). As used herein, "solution" does not require complete solubility of the solid; rather, the solution may have some undissolved material, preferably, however, there is a sufficient amount of the material that can be carried by the organic solvent into the vapor phase for chemical vapor deposition processing. If solvent dilution is used in deposition, the total molar concentration of solvent vapor generated may also be considered as a carrier gas.

Herein, vaporized precursor composition includes vaporized molecules of precursor complexes of Formula I either alone or optionally with vaporized molecules of other compounds in the precursor composition, including solvent molecules, if used.

Methods of the present invention are particularly well suited for forming layers on a surface of a semiconductor substrate or substrate assembly, such as a silicon wafer, with or without layers or structures formed thereon, used in forming integrated circuits. It is to be understood that methods of the present invention are not limited to deposition on silicon wafers; rather, other types of wafers (e.g., gallium arsenide wafer, etc.) can be used as well. Also, the methods of the present invention can be used in silicon-on-insulator technology. Furthermore, substrates other than semiconductor substrates or substrate assemblies can be used in methods of the present invention. These include, for example, fibers, wires, etc. If the substrate is a semiconductor substrate or substrate assembly, the layers can be formed directly on the lowest semiconductor surface of the substrate, or they can be formed on any of a variety of the layers (i.e., surfaces) as in a patterned wafer, for example. Thus, the term "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate having one or more layers or structures formed thereon.

DETAILED DESCRIPTION OF PREFERRED EMBODIMENTS

Figure 1:
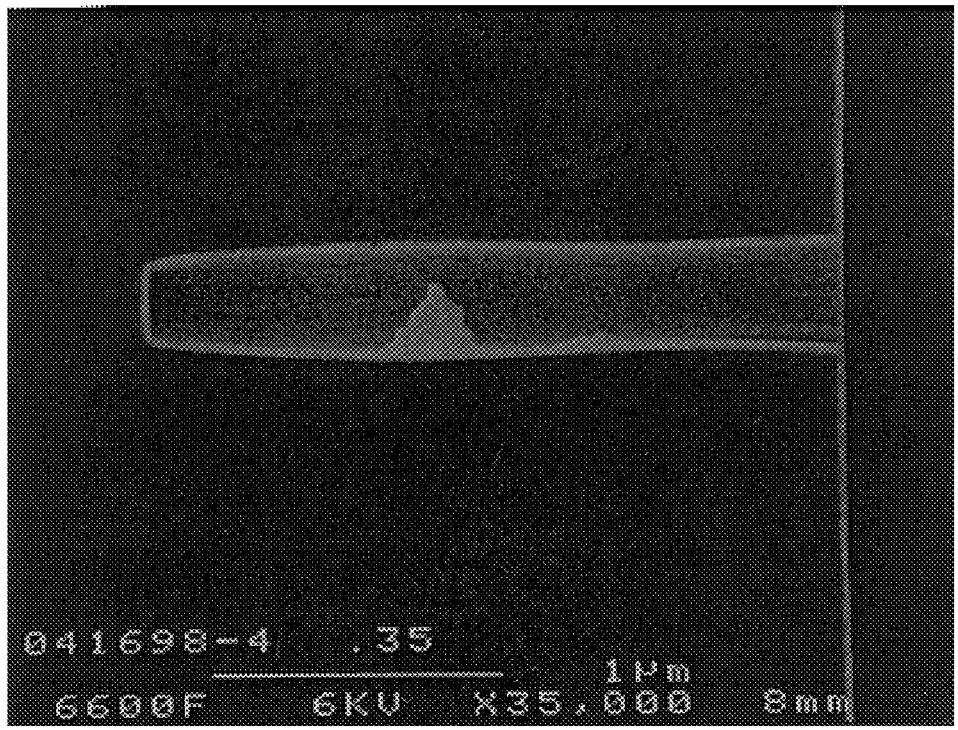
FIG. 1 is a cross-sectional SEM of a thin generally conformal iridium metal layer.

The present invention provides methods of forming generally conformal iridium layers (preferably, iridium metal layers optionally including oxides of iridium, and more preferably electrically conductive iridium metal layers). Specifically, the present invention is directed to methods of manufacturing a semiconductor device, particularly a ferroelectric device, having a generally conformal iridium layer. The iridium layers formed are preferably conductive and can be used as barrier layers between the dielectric material and the silicon substrate in memory devices, such as ferroelectric memories, or as the plate (i.e., electrode) itself in the capacitors, for example. Because they are generally unreactive, such layers are also suitable for use in optics applications as a reflective coating or as a high temperature oxidation barrier on carbon composites, for example. They can be deposited in a wide variety of thicknesses, depending on the desired use.

The present invention provides methods of forming a generally conformal layer using one or more iridium complexes. These complexes are typically mononuclear (i.e., monomers in that they contain one metal per molecule), although they can be in the form of weakly bound dimers (i.e., dimers containing two monomers weakly bonded together through hydrogen or dative bonds). Herein, such monomers and weakly bound dimers are shown as mononuclear complexes.

Suitable complexes for use in methods of the present invention are neutral complexes and may be liquids or solids at room temperature. Typically, they are liquids. If they are solids, they are sufficiently soluble in an organic solvent to allow for vaporization, they can be vaporized or sublimed from the solid state, or they have melting temperatures below their decomposition temperatures. Thus, complexes described herein can be used in precursor compositions for chemical vapor deposition (CVD). Chemical vapor deposition techniques are desired because they are more suitable for deposition on semiconductor substrates or substrate assemblies, particularly in contact openings which are extremely small and typically require generally conformally filled layers. Examples of chemical vapor deposition techniques that can be used in the present invention include flash vaporization techniques, bubbler techniques, and/or microdroplet techniques. Preferred embodiments of the complexes described herein are particularly suitable for low temperature CVD, e.g., deposition techniques involving substrate temperatures of about 200° C. to about 400° C.

The iridium complex is of the following formula, which is shown as a monomer, although weakly bound dimers are also possible (and included within the scope of this representation):

CpIr(CO)$_2$ (Formula I)

wherein Cp is a substituted or unsubstituted cyclopentadienyl ligand. Suitable substituents on the cyclopentadienyl ligand include: alkyl groups such as methyl, ethyl, propyl, butyl, and pentyl; alkenyl groups such as vinyl, allyl, and butenyl; and silicon-containing groups such as alkylsilyl, chlorosilyl, and aminosilyl. A particularly preferred class of complexes of Formula I include (RC$_5$H$_4$)Ir(CO)$_2$, where R represents one or more substituents such as methyl, ethyl, vinyl, etc., on the cyclopentadienyl group (Cp). Typically, those complexes containing R groups with a low number of carbon atoms (e.g., 1–4 carbon atoms per R group) are more suitable for use with vapor deposition techniques. Of these, monomethyl cyclopentadienyl is particularly preferred. This class of complexes of Formula I is particularly advantageous because they are liquids and can be delivered to the CVD chamber using simple bubbler techniques.

Complexes used in the present invention can be prepared by a variety of methods known to one of skill in the art. For example, (C$_5$H$_5$)Ir(CO)$_2$ can be prepared by reaction of chlorotricarbonyl iridium(I) with cyclopentadienyl-lithium in THF solvent.

Various combinations of the complexes described herein can be used in a precursor composition. Thus, as used herein, a "precursor composition" refers to a liquid or solid that includes one or more complexes of Formula I optionally mixed with one or more complexes of formulas other than those of Formula I. The precursor composition can also include one or more organic solvents suitable for use in a chemical vapor deposition system, as well as other additives, such as free ligands, that assist in the vaporization of the desired compounds.

Solvents that are suitable for this application can be one or more of the following organic solvents: saturated or unsaturated linear, branched, or cyclic aliphatic (alicyclic) hydrocarbons (C$_3$–C$_{20}$, and preferably C$_5$–C$_{10}$), aromatic hydrocarbons (C$_5$–C$_{20}$, and preferably C$_5$–C$_{10}$), halogenated hydrocarbons, silylated hydrocarbons such as alkylsilanes, alkylsilicates, ethers, polyethers, thioethers, esters, lactones, ammonia, amides, amines (aliphatic or aromatic, primary, secondary, or tertiary), polyamines, nitriles, cyanates, isocyanates, thiocyanates, silicone oils, aldehydes, ketones, diketones, carboxylic acids, water, alcohols, thiols, or compounds containing combinations of any of the above or mixtures of one or more of the above. It should be noted that some precursor complexes are sensitive to reactions with protic solvents, and examples of these noted above may not be ideal, depending on the nature of the precursor complex. They are also generally compatible with each other, so that mixtures of variable quantities of the complexes will not interact to significantly change their physical properties.

One preferred method of the present invention involves vaporizing a precursor composition that includes one or more iridium complexes in the presence of a carrier gas, preferably an inert carrier gas, and an oxidizing gas to form a generally conformal iridium layer. The carrier gas is typically selected from the group consisting of nitrogen, helium, argon, and mixtures thereof. In the context of the present invention, an inert carrier gas is one that is generally unreactive with the complexes described herein and does not interfere with the formation of an iridium layer. The oxidizing gas can be selected from a wide variety of gases reactive with the complexes described herein, at least at a surface under the conditions of chemical vapor deposition. Examples of oxidizing gases include $H_2O$, $H_2O_2$, $O_2$, $O_3$, $N_2O$, and $SO_3$. Preferably, the oxidizing gas is oxygen. Various combinations of carrier gases and oxidizing gases can be used in the methods of the present invention to form generally conformal iridium layers.

Significantly, the methods of the present invention form generally conformal iridium layers and typically do not form "islands" or "beads" (i.e., segregated areas of metal and exposed substrate) after rapid thermal oxidation treatment, for example, under conditions of 750° C. for 1 minute. This is significant because island and bead formation (resulting in noncontinuous layers) has been a serious problem for platinum layers and iridium layers.

Generally, the relative amounts of precursor, carrier gas, and oxidizing gas can be adjusted to control the step coverage, along with conditions such as substrate temperature and chamber pressure. For example, increasing the amount of precursor in the carrier gas may require an increase in the amount of oxidizing gas used to maintain the desired level of step coverage. In certain preferred embodiments, the partial pressure of $CpIr(CO)_2$ in the carrier gas is about 0.001 torr to about 10 torr. Preferably, in the methods of the invention the ratio of the total number of moles of carrier gases to the total number of moles of oxidizing gases is at least about 0.6:1.0 and no more than about 1.4:1.0, more preferably, at least about 0.7:1.0 and no more than about 1.3:1.0, and most preferably, the total number of moles of carrier gases to the total number of moles of oxidizing gases is substantially similar. In this context "substantially similar" means that the total number of moles of carrier gases to oxidizing gases are within about 10% of each other.

As stated above, the use of the iridium complexes and methods of forming iridium layers of the present invention are beneficial for a wide variety of thin film applications in integrated circuit structures, particularly those using high dielectric materials or ferroelectric materials. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

A specific example of a layer formed from a method of the present invention is shown FIG. 1. This figure is a photograph of the cross-section of a contact hole, lined with an iridium layer that was formed using a method of the present invention. This photograph is a scanning electron micrograph (SEM) with 35,000× magnification; the hole is approximately 0.35 micron in diameter and 2.5 microns deep in a layer of BPSG. The iridium layer measures approximately 300 Angstroms in the bottom of the hole as well as on the top surface, making the step coverage approximately 100%. This layer was formed according to the method described in the Examples.

Such generally conformal layers can be used in memory cells that include an electrode in contact with a silicon-containing layer, such as an n-type or p-type silicon substrate, silicon dioxide, glass, etc., with a conductive iridium layer positioned between the electrode and the silicon-containing layer to act as a barrier to diffusion of atoms such as silicon into the electrode.

Methods of the present invention can be used to deposit a generally conformal iridium layer on a variety of substrates, such as a semiconductor wafer (e.g., silicon wafer, gallium arsenide wafer, etc.), glass plate, etc., and on a variety of surfaces of the substrate, whether it be directly on the substrate itself or on a layer of material deposited on the substrate as in a semiconductor substrate assembly. The layer is deposited upon decomposition (typically, thermal decomposition) of a complex of Formula I, preferably one that is either a volatile liquid, a sublimable solid, or a solid that is soluble in a suitable solvent that is not detrimental to the substrate, other layers thereon, etc. Preferably, however, solvents are not used; rather, the transition metal complexes are liquid and used neat. Methods of the present invention preferably utilize vapor deposition techniques, such as flash vaporization, bubbling, etc.

Figure 2:
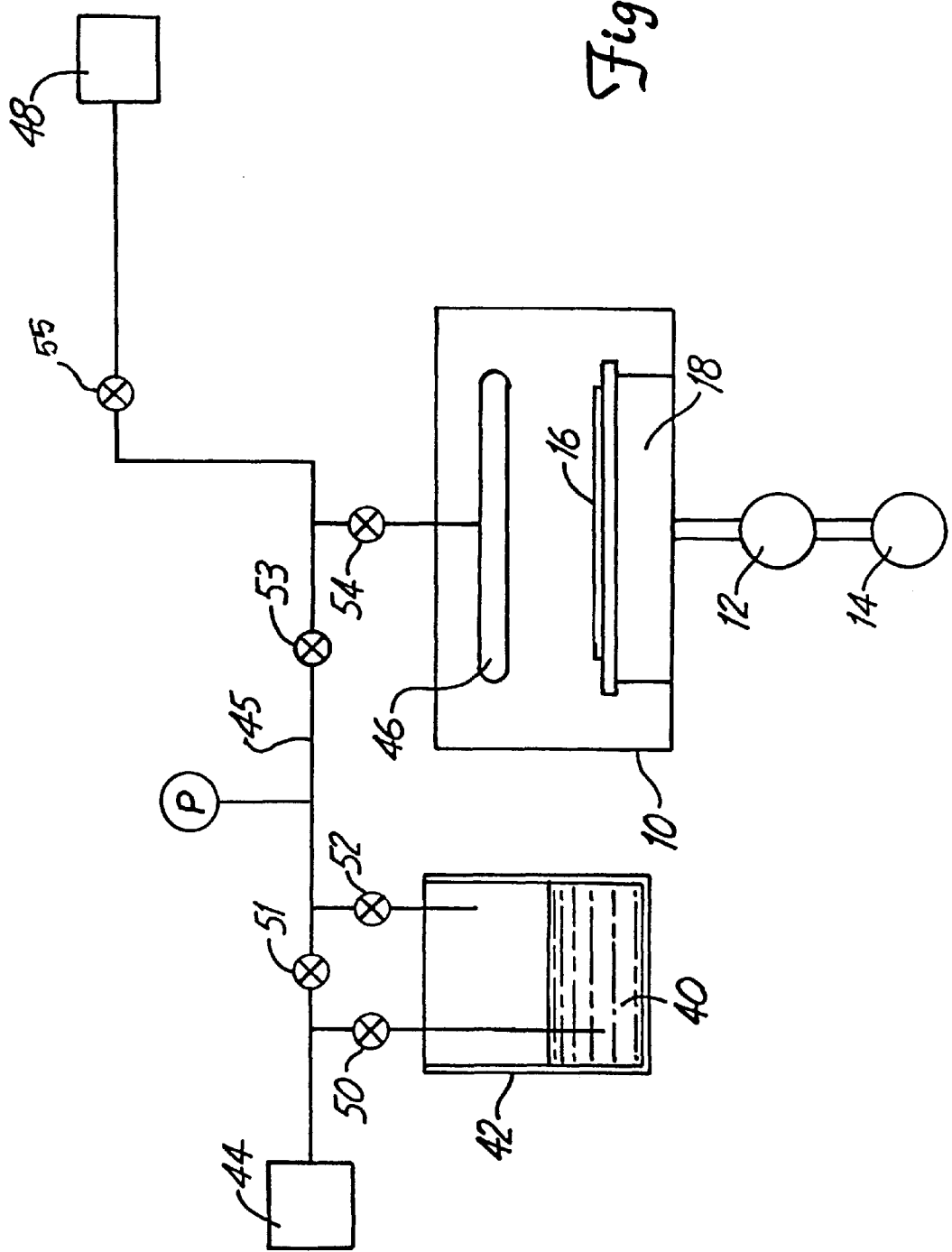
FIG. 2 is a schematic of a chemical vapor deposition system suitable for use in the methods of the present invention.

A typical chemical vapor deposition (CVD) system that can be used to perform methods of the present invention is shown in FIG. 2. The system includes an enclosed chemical vapor deposition chamber 10, which may be a cold wall-type CVD reactor. For good step coverage, the CVD process may be carried out at pressures of from about 1 torr to about 5 torr, and preferably at about 3 torr to about 4 torr. Such pressures can be created in chamber 10 using turbo pump 12 and backing pump 14.

One or more substrates 16 (e.g., semiconductor substrates or substrate assemblies) are positioned in chamber 10. For good step coverage to form a generally conformal layer, a constant nominal temperature is established for the substrate, preferably at a temperature of about 200° C. to about 350° C., and more preferably at a temperature of about 250° C. to about 300° C. Substrate 16 may be heated, for example, by an electrical resistance heater 18 on which substrate 16 is mounted. Other known methods of heating the substrate may also be utilized.

In the use of this particular system, the precursor composition 40, which contains one or more complexes of Formula I, is stored in liquid form (a neat liquid at room temperature or at an elevated temperature if solid at room temperature) in vessel 42. A source 44 of a suitable carrier gas is transferred under pressure into vessel 42 and bubbled through the neat liquid (i.e., without solvent) picking up the precursor composition and carrying it into chamber 10 through line 45 and gas distributor 46. Additional carrier gas or oxidizing gas may be supplied from source 48 as needed to provide the desired concentration of precursor composition and regulate the uniformity of the deposition across the surface of substrate 16. Valves 50–55 are opened and closed as required. Typically, increasing the temperature of the vessel (e.g., bubbler) will cause an increase in the partial pressure of the precursor in the carrier gas, which may require a resultant change in the partial pressure of the oxidizing gas to maintain the desired level of step coverage.

Generally, the precursor composition as well as carrier and oxidizing gases are transferred into the CVD chamber 10 at a flow rate of about 1 sccm (standard cubic centimeters) to about 1000 sccm. The semiconductor substrate is exposed to the precursor composition at a pressure of about 1 torr to about 5 torr for a time of about 0.01 minute to about 100 minutes. In chamber 10, the precursor composition will form an adsorbed generally conformal layer on the surface of the substrate 16. As the deposition rate is temperature dependent in a certain temperature range, increasing the temperature of the substrate will typically increase the rate of deposition. Typical deposition rates are about 10 Angstroms/minute to about 1000 Angstroms/minute. The carrier gas containing the precursor composition is terminated by closing valve 53.

Figure 3:
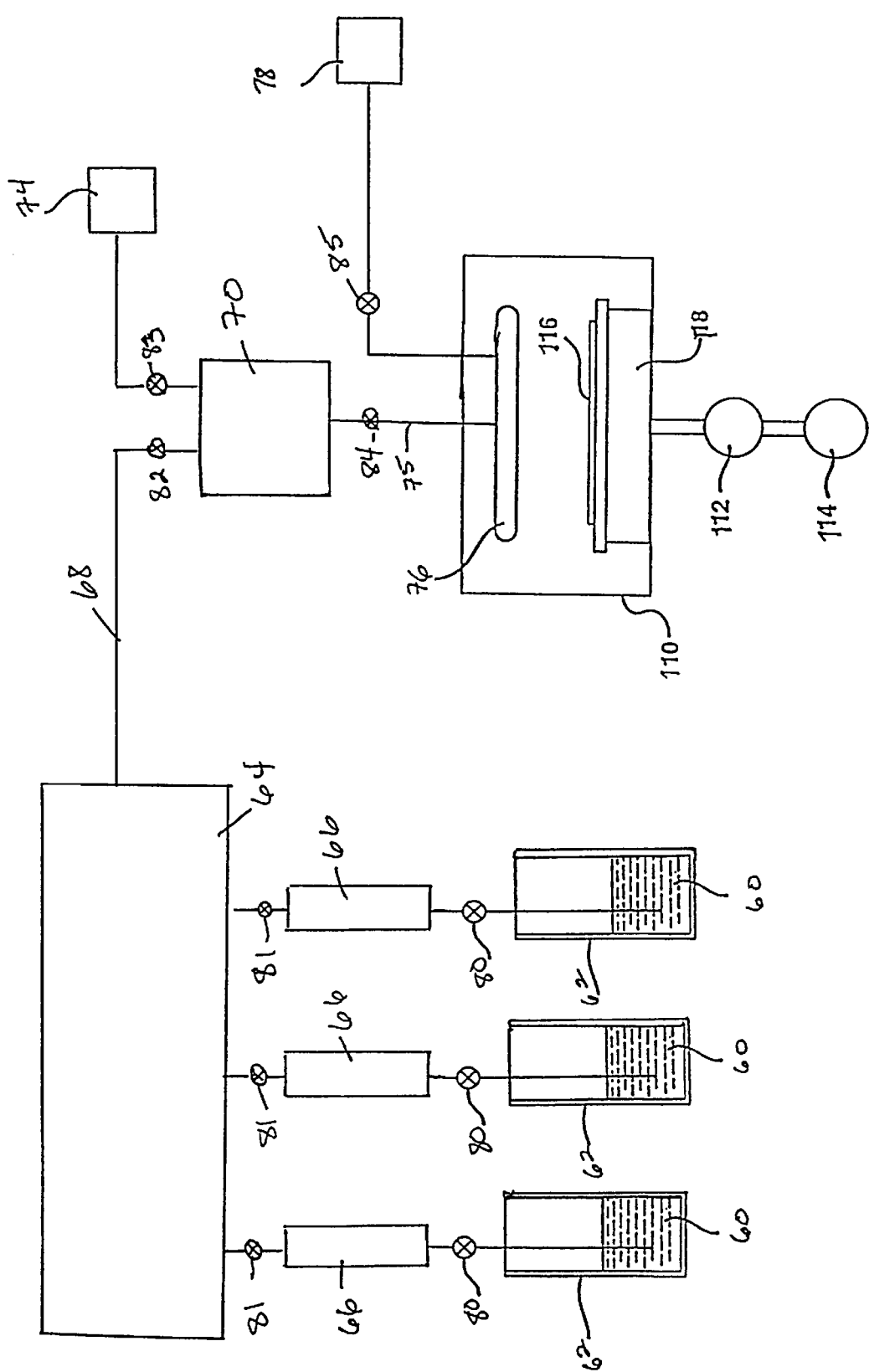
FIG. 3 is a schematic of an alternative chemical vapor deposition system suitable for use in the methods of the present invention.

An alternative CVD system that can be used to perform methods of the present invention is shown in FIG. 3. The system includes an enclosed chemical vapor deposition chamber 110, which may be a cold wall-type CVD reactor, in which a vacuum may be created using turbo pump 112 and backing pump 114. One or more substrates 116 (e.g., semiconductor substrates or substrate assemblies) are positioned in chamber 110. Substrate 116 may be heated as described with reference to FIG. 2 (for example, by an electrical resistance heater 118).

In the use of this system, one or more solutions 60 of one or more precursor complexes of Formula I, are stored in vessels 62. The solutions are transferred to a mixing manifold 64 using pumps 66. The resultant precursor composition containing one or more precursor complexes and one or more organic solvents is then transferred along line 68 to vaporizer 70, to volatilize the precursor composition. A source 74 of a suitable inert gas is pumped into vaporizer 70 for carrying volatilized precursor composition into chamber 110 through line 75 and gas distributor 76. Oxidizing gas may be supplied from source 78 as needed. As shown, a series of valves 80–85 are opened and closed as required. Similar pressures and temperatures to those described with reference to FIG. 2 can be used.

Alternatives to such methods include an approach wherein the precursor composition is heated and vapors are drawn off and controlled by a vapor mass flow controller, and a pulsed liquid injection method as described in "Metalorganic Chemical Vapor Deposition By Pulsed Liquid Injection Using An Ultrasonic Nozzle: Titanium Dioxide on Sapphire from Titanium (IV) Isopropoxide," by Versteeg, et al., *Journal of the American Ceramic Society*, 78, 2763–2768 (1995). The complexes of Formula I are also particularly well suited for use with vapor deposition systems, as described in copending application U.S. Ser. No. 08/720,710 entitled "Method and Apparatus for Vaporizing Liquid Precursor compositions and System for Using Same," filed on Oct. 2, 1996. Generally, one method described therein involves the vaporization of a precursor composition in liquid form (neat or solution). In a first stage, the precursor composition is atomized or nebulized generating high surface area microdroplets or mist. In a second stage, the constituents of the microdroplets or mist are vaporized by intimate mixture of the heated carrier gas. This two stage vaporization approach provides a reproducible delivery for precursor compositions (either in the form of a neat liquid or solid dissolved in a liquid medium) and provides reasonable growth rates, particularly in device applications with small dimensions.

Various combinations of carrier gases and oxidizing gases can be used in certain methods of the present invention. They can be introduced into the chemical vapor deposition chamber in a variety of manners, such as directly into the vaporization chamber or in combination with the precursor composition. Although specific vapor deposition processes are described by reference to FIGS. 2–3, methods of the present invention are not limited to being used with the specific vapor deposition systems shown. Various CVD reaction chambers can be used, including hot wall or cold wall reactors, atmospheric or reduced pressure reactors, as well as plasma enhanced reactors. Furthermore, methods of the present invention are not limited to any specific vapor deposition techniques.

EXAMPLES

The following examples are offered to further illustrate the various specific and preferred embodiments and techniques. It should be understood, however, that many variations and modifications may be made while remaining within the scope of the present invention.

Synthesis of $\{(CH_3)C_5H_4\}Ir(CO)_2$

In an inert-atmosphere glove box, a flask was charged with 2.0 g (6.4 mmol) of chlorotricarbonyliridium (I) (Strem Chemicals, Inc., Newburyport, Mass.). The compound was suspended in 100 mL of hexanes and stirred during the addition of a solution of methylcyclopentadienyl lithium (12.8 mL of 0.5 M in THF). The flask was equipped with a condenser and the mixture was refluxed for 24 hours. The solvent was then removed in vacuo. The crude product was purified by vacuum distillation; an orange colored liquid product was collected at 58° C. at approximately 200 mTorr. The product was characterized by IR and NMR spectroscopy.

CVD of an Iridium Layer

The iridium layer of FIG. 1 was deposited onto a silicon wafer substrate containing a top layer of BPSG into which holes of various sizes were previously etched. A bubbler containing $\{(CH_3)C_5H_4\}Ir(CO)_2$ was connected to a CVD chamber such that carrier gas would pass through the liquid precursor and take vapor of the compound into the chamber. The bubbler was heated to 50° C. and the lines connecting the bubbler to the chamber were heated to 50° C. to prevent condensation. Using a carrier gas flow, of 20 sccm He, an oxygen gas flow (plumbed to the chamber via a separate line) of 25 sccm, and a chamber pressure of 3 torr, a layer was deposited for 10 minutes. The substrate was heated to 250° C. during the deposition, as measured by a chromel-alumel thermocouple, which was in direct contact with the top surface of the substrate. The resistivity of the as-deposited layer was 15 Ω/sq. FIG. 1 shows a conformal iridium layer.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. The complete disclosures of all patents, patent documents, and publications listed herein are incorporated by reference, as if each were individually incorporated by reference.

What is claimed is:

1. A method of manufacturing a semiconductor structure, the method comprising:

providing a semiconductor substrate or substrate assembly;

heating the semiconductor substrate or substrate assembly to a temperature of about 200° C. to about 350° C.;

providing a precursor composition comprising one or more complexes of the formula:

$$CpIr(CO)_2$$

wherein Cp is a substituted or unsubstituted cyclopentadienyl ligand; heating and vaporizing the precursor composition to form vaporized precursor composition to provide a partial pressure of $CpIr(CO)_2$ of at least about 0.001 torr in one or more carrier gases; and directing the vaporized precursor composition in the presence of one or more carrier gases and one or more oxidizing gases toward the semiconductor substrate or substrate assembly to form a generally conformal iridium metal layer or iridium oxide layer on a surface of the semiconductor substrate or substrate assembly.

2. The method of claim 1 wherein the precursor composition further includes one or more solvents.

3. The method of claim 1 wherein the ratio of the total number of moles of carrier gases to the total number of moles of oxidizing gases is within a range of about 0.6:1.0 to about 1.4:1.0.

4. The method of claim 3 wherein the ratio of the total number of moles of carrier gases to the total number of moles of oxidizing gases is within a range of about 0.7:1.0 to about 1.3:1.0.

5. The method of claim 4 wherein the ratio of the total number of moles of carrier gases to the total number of moles of oxidizing gases is substantially similar.

6. The method of claim 1 wherein vaporizing the precursor composition to form vaporized precursor comprises flash vaporizing, bubbling, forming microdroplets, or combinations thereof.

7. The method of claim 1 wherein the semiconductor substrate is a silicon wafer or a gallium arsenide wafer.

8. The method of claim 1 wherein the partial pressure of $CpIr(CO)_2$ in the one or more carrier gases is about 0.001 torr to about 10 torr.

9. The method of claim 1 wherein the precursor composition is a liquid.

10. The method of claim 9 wherein the liquid precursor composition comprises a solid dissolved in a solvent.

11. The method of claim 1 wherein the generally conformal iridium metal layer or iridium oxide layer has at least about 70% step coverage.

12. The method of claim 1 wherein Cp is monomethyl cyclopentadienyl.

13. A method of manufacturing a semiconductor structure, the method comprising:
providing a semiconductor substrate or substrate assembly
heating the semiconductor substrate or substrate assembly to a temperature of about 200° C. to about 350° C.;
providing a precursor composition comprising one or more complexes of the formula:

$$CpIr(CO)_2$$

wherein Cp is a substituted or unsubstituted cyclopentadienyl ligand; and heating and vaporizing the precursor composition to form vaporized precursor composition to provide a partial pressure of $CpIr(CO)_2$ of at least about 0.001 torr; and
directing the vaporized precursor composition in the presence of one or more carrier gases and one or more oxidizing gases toward the semiconductor substrate or substrate assembly to form a generally conformal iridium metal layer or iridium oxide layer on a surface of the semiconductor substrate or substrate assembly;
wherein:
the ratio of the total number of moles of carrier gases to the total number of moles of oxidizing gases is within a range of about 0.6:1.0 to about 1.4:1.0; and the generally conformal iridium metal layer or iridium oxide layer has at least about 70% step coverage.

14. A method of forming a layer on a substrate, the method comprising:
providing a substrate;
heating the substrate to a temperature of about 200° C. to about 350° C.;
providing a precursor composition comprising one or more complexes of the formula:

$$CpIr(CO)_2$$

wherein Cp is a substituted or unsubstituted cyclopentadienyl ligand; and heating and vaporizing the precursor composition to form vaporized precursor composition to provide a partial pressure of $CpIr(CO)_2$ of at least about 0.001 torr in one or more carrier gases; and
directing the vaporized precursor composition in the presence of one or more carrier gases and one or more oxidizing gases toward the substrate to form a generally conformal iridium metal layer or iridium oxide layer on a surface of the substrate.

15. The method of claim 14 wherein the ratio of the total number of moles of carrier gases to the total number of moles of oxidizing gases is within a range of about 0.6:1.0 to about 1.4:1.0.

16. The method of claim 15 wherein the ratio of the total number of moles of carrier gases to the total number of moles of oxidizing gases is substantially similar.

17. The method of claim 14 wherein the generally conformal iridium metal layer or iridium oxide layer has at least about 70% step coverage.

18. A method of forming a layer on a substrate, the method comprising
providing a substrate;
heating the substrate to a temperature of about 200° C. to about 350° C.;
providing a precursor composition comprising one or more complexes of the formula:

$$CpIr(CO)_2$$

wherein Cp is a substituted or unsubstituted cyclopentadienyl ligand; and heating and vaporizing the precursor composition to form vaporized precursor composition to provide a partial pressure of $CpIr(CO)_2$ of at least about 0.001 torr in one or more carrier gases; and
directing the vaporized precursor composition in the presence of one or more carrier gases and one or more oxidizing gases toward the substrate to form a generally conformal iridium metal layer or iridium oxide layer on a surface of the substrate;
wherein: the ratio of the total number of moles of carrier gases to the total number of moles of oxidizing gases is within a range of about 0.6:1.0 to about 1.4:1.0; and
the generally conformal iridium metal layer or iridium oxide layer has at least about 70% step coverage.

* * * * *